United States Patent [19]

Tsubouchi et al.

[11] Patent Number: 4,763,179
[45] Date of Patent: Aug. 9, 1988

[54] SEMICONDUCTOR MEMORY DEVICE

[75] Inventors: Natsuro Tsubouchi; Masafumi Kimata, both of Itami, Japan

[73] Assignee: Mitsubishi Denki Kabushiki Kaisha, Tokyo, Japan

[21] Appl. No.: 67,398

[22] Filed: Jun. 24, 1987

Related U.S. Application Data

[63] Continuation of Ser. No. 800,377, Nov. 22, 1985, abandoned.

[30] Foreign Application Priority Data

Dec. 5, 1984 [JP] Japan .................. 59-258671

[51] Int. Cl.$^4$ ............................. H01L 29/78
[52] U.S. Cl. .................... 357/23.6; 357/51; 357/55; 148/DIG. 14
[58] Field of Search ............... 148/DIG. 14; 437/919, 437/67, 63, 65, 52, 60; 357/23.6, 51, 55

[56] References Cited

FOREIGN PATENT DOCUMENTS

| 0044400 | 1/1982 | European Pat. Off. |
| 0085988 | 8/1983 | European Pat. Off. |
| 0088451 | 9/1983 | European Pat. Off. |
| 0108390 | 5/1984 | European Pat. Off. |
| 130178 | 12/1978 | Japan .................. 357/23.6 |
| 3269 | 1/1983 | Japan .................. 357/23.6 |
| 2075752 | 11/1981 | United Kingdom. |
| 2138207 | 10/1984 | United Kingdom. |

OTHER PUBLICATIONS

IBM Technical Disclosure Bulletin, vol. 22, No. 3, Aug. 1979, pp. 1000–1001.
IBM Technical Disclosure Bulletin, vol. 25, No. 2, Jul. 1982, pp. 593–596.
IBM Technical Disclosure Bulletin, vol. 26, No. 2, Jul. 1983, pp. 489–490.
"A Corrugated Capacitor Cell (CCC) for Megabit Dynamic MOS Memories", by H. Sunami et al, IEDM 82, 26.9, pp. 806–808.

Primary Examiner—Martin H. Edlow
Attorney, Agent, or Firm—Lowe, Price, LeBlanc, Becker & Shur

[57] ABSTRACT

A semiconductor memory device such as a MOS dynamic RAM comprises transistor portions (2, 3 and 5) for writing and reading a signal and capacitor portions (1, 2, 6 and 9) by pn junction for storing a signal. The capacitor portions have preferably as large a capacitance as possible. For this purpose, a capacitor hole (7) is formed in a p type semiconductor substrate (6) and an n type semiconductor region (9) is provided along the capacitor hole (7) so that the pn junction area therebetween is increased and the capacitance is made large.

3 Claims, 3 Drawing Sheets

SEMICONDUCTOR MEMORY DEVICE

This application is a continuation of Application Ser. No. 800,377, filed Nov. 22, 1985 now abandoned.

BACKGROUND OF THE INVENTION

1. Field of the Invention

The present invention relates to a semiconductor memory device and particularly to a MOS dynamic RAM.

2. Description of the Prior Art

In the prior art, the one-transistor and one-capacitor system is often adopted in a memory cell of a MOS dynamic RAM. FIG. 1 is a top view of a memory cell of a conventional MOS dynamic RAM and FIG. 2 is a cross sectional view taken along the line A—A' in FIG. 1.

First, the structure of the conventional device will be described. On a p type silicon substrate 6, a first polysilicon gate 2 is formed through a first gate oxide film 1 and a second polysilicon gate 3 is formed through a second gate oxide film 4. In addition, on the p type silicon substrate 6, an n+ type semiconductor region 5 is formed. The first polysilicon gate 2, the first gate oxide film 1 and the p type silicon substrate 6 constitute a first transistor. A capacitor is formed between a lower portion of the first polysilicon gate 2 and a channel portion just under the first gate oxide film 1. The n+ semiconductor region 5, the second polysilicon gate 3 and a source region or a drain region just under the first gate oxide film 1 constitute a second transistor. The capacitor of the first transistor and the second transistor constitute a memory cell. The capacitance of the capacitor serves as a capacitance for storing data and the second transistor is used for writing and reading a signal in the capacitor.

Now, the operation of this conventional device will be described. In the memory cell, a power supply voltage is normally applied to the first polysilicon gate 2 and the capacitor is used as a memory device. Writing of a content in the capacitor is performed in the following manner. Normally, a potential according to the content to be written, for example, a plus voltage if the content is "1" or a zero voltage if the content is "0" is applied to the n+ type semiconductor region 5 and then, a plus voltage is applied to the second polysilicon gate 3 corresponding to the gate of a writing transistor to conduct the second transistor, whereby "1" or "0" is written in the capacitor. Then, the second polysilicon gate 3 is grounded so that the content in the capacitor is maintained. Reading of the content from the capacitor is performed in the following manner. A plus voltage is applied again to the second polysilicon gate 3 to conduct the second transistor so that the potential of the n+ type semiconductor region 5 is changed according to the content of the memory capacitor. The change of the potential is amplified by a sense amplifier.

Recently, according to an increasing demand for large-scale integration and high density of memories, the area of an ordinary capacitor has been made small. For example, compared with a 16K bit RAM in which the area of a capacitor was about 400 $\mu m^2$, the area of a capacitor in a 64K bit RAM is about 200 $\mu m^2$ and that in a 256K bit RAM is about 70 $\mu m^2$.

In order to prevent a decrease in a capacitance due to such reduction of a capacitor area, a method for making thin a gate oxide film, for example, is often adopted. However, in view of a higher degree of integration of memories developed in future, decrease of a capacitance is considered to be unavoidable. In addition, since a capacitor of a conventional MOS dynamic RAM has a plane structure, a problem is involved that the capacitance is decreased due to the reduction of a capacitor area caused by such high degree of integration.

SUMMARY OF THE INVENTION

The present invention has solved the above described problems and an object of the present invention is to provide a semiconductor memory device in which the capacitance of a capacitor can be made large with the plane area of the semiconductor memory device being maintained small.

Briefly stated, in the present invention, a semiconductor region of a second conductive type formed on a substrate of a first conductive type has a curved surface portion extending to the inward of the substrate. Thus, the surface of the semiconductor region of the second conductive type includes a curved surface portion in the substrate of the first conductive type and as a result, the surface area of a capacitor formed between the substrate of the first conductive type and the semiconductor region of the second conductive type is increased. Therefore, without increasing the plane area of the semiconductor memory device, the capacitance of the capacitor can be increased and accordingly, the semiconductor memory device of the present invention can be adapted for a high degree of integration of memories.

These object and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
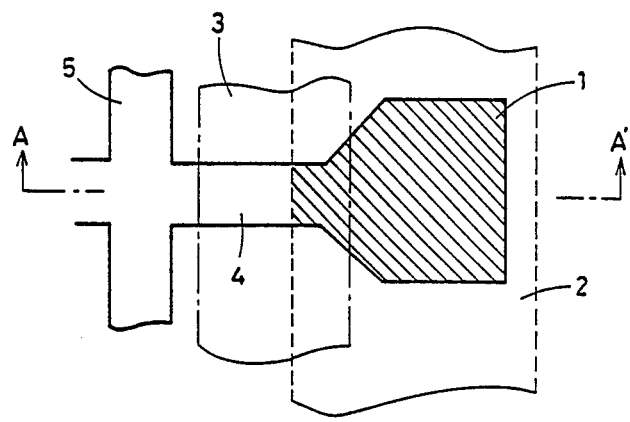
FIG. 1 is a top view of a memory cell of a conventional MOS dynamic RAM.
Figure 2:
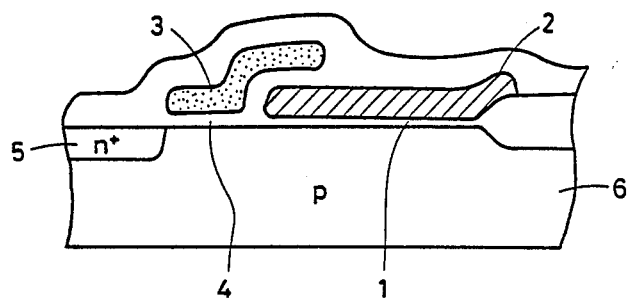
FIG. 2 is a cross sectional view taken along the line A—A' in FIG. 1.
Figure 3:
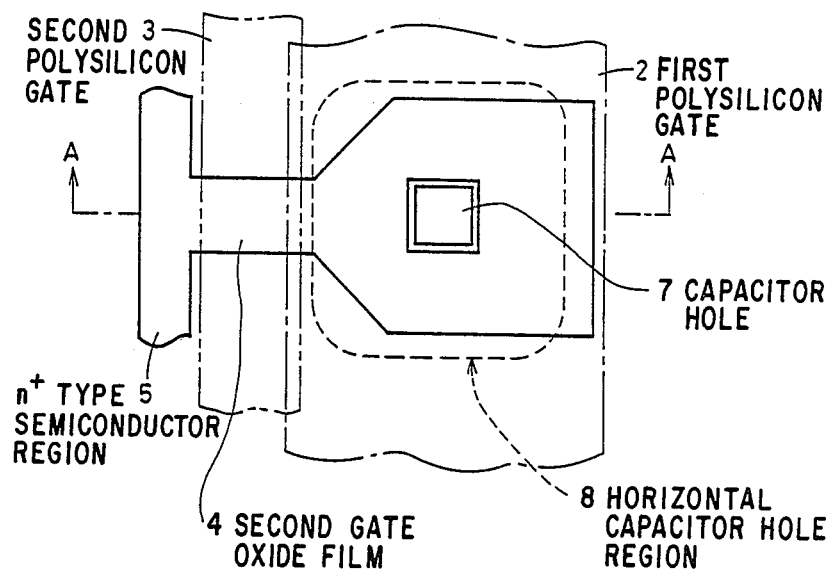
FIG. 3 is a top view of a memory cell of a semiconductor memory device in accordance with an embodiment of the present invention.
Figure 4:
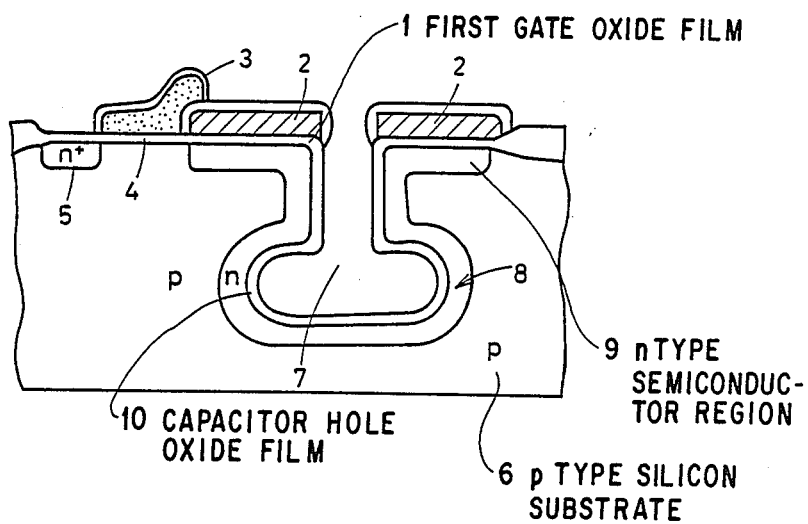
FIG. 4 is a cross sectional view taken along the line A—A' in FIG. 3.
Figure 5A:
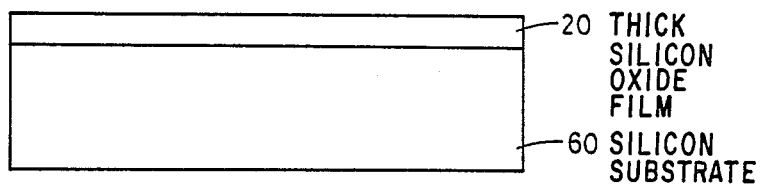
FIG. 5 shows steps of forming a capacitor hole of a semiconductor memory device in accordance with an embodiment of the present invention.
Figure 5B:
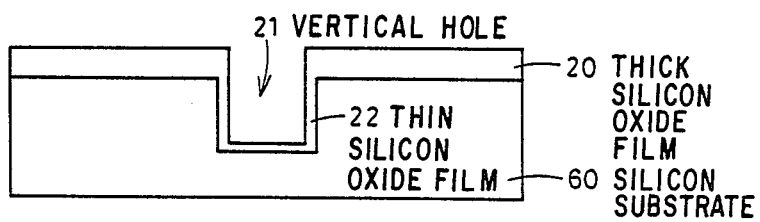
Figure 5C:
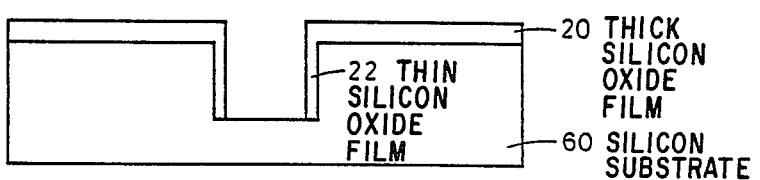
Figure 5D:
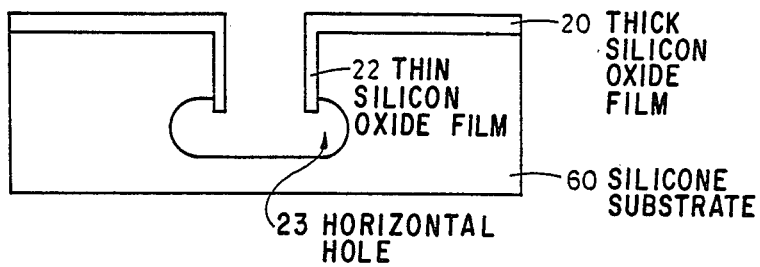

FIG. 3 is a top view of a memory cell of a semiconductor memory device in accordance with an embodiment of the present invention and FIG. 4 is a cross sectional view taken along the line A—A' in FIG. 3.

Referring to FIGS. 3 and 4, the reference numeral 1 indicates a first gate oxide film; the reference numeral 2 indicates a first polysilicon gate; the reference numeral 3 indicates a second polysilicon gate; the reference numeral 4 indicates a second gate oxide film; the reference numeral 5 indicates an n+ type semiconductor region; and the reference numeral 6 indicates a p type silicon substrate. These portions function in the same manner as in a conventional device.

A characteristic feature of a memory cell of a MOS dynamic RAM of this embodiment resides in that: a capacitor hole 7 is formed by selectively etching the p type silicon substrate 6 in a memory capacitor region and the capacitor hole 7 is surrounded by an n type semiconductor region 9 and the p type silicon substrate 6, whereby a capacitor having a large surface area is newly formed by the p type silicon substrate 6 and the n type semiconductor region 9. The reference numeral 8 indicates a horizontal capacitor hole region.

Now, the process of manufacturing the semiconductor memory device of this embodiment will be described. Except for the steps of forming the capacitor hole 7, the manufacturing process of this embodiment is the same as the manufacturing process of a conventional MOS dynamic RAM. The capacitor hole 7 is formed prior to the known step for forming the first gate oxide film 1 of an ordinary capacitor of a MOS dynamic RAM (that is, a capacitor formed between a lower portion of the first polysilicon gate 2 and a channel portion just under the first gate oxide film 1). Then, by a diffusion process, the n type semiconductor region 9 is formed on the surface of the capacitor hole 7 and subsequently, the known step follows in which the first gate oxide film 1 of ordinary capacitor is formed and the, the capacitor hole oxide film 10 is formed.

The above described manufacturing process of the capacitor hole 7 will be more specifically described with reference to FIG. 5. A thick silicon oxide film 20 (for example, SiO$_2$ of 5000 Å obtained by thermal oxidation) is formed on the surface of the silicon substrate 60 in the capacitor region (FIG. 5(a)). Then, a vertical hole 21 is formed in the silicon substrate 60 and the silicon oxide film 20 by reactive ion etching and a thin silicon oxide film 22 (for example, SiO$_2$ of 2000 Å) is formed on the surface of the vertical hole 21 (FIG. 3(b)). Subsequently, only the bottom portion of the thin silicon oxide film 22 of the vertical hole 21 is removed by reactive ion etching (FIG. 3(c)). Then, a horizontal hole 23 is formed by isotropic wet etching of fluorate or nitrate or by isotropic dry etching of CF$_4$ (FIG. 3(d)). By the above described steps, the capacitor hole 7 having a sectional structure as shown in FIG. 4 is obtained.

The above described structure makes it possible to largely increase the effective surface area of the n type semiconductor region 9 serving as an electrode of the capacitor. Thus, a capacitance can be increased as compared with a conventional MOS dynamic RAM. The increase of a capacitance will be extremely effective in forming a VLSI memory in future.

Although in the foregoing description of the structure, increase of the capacitance of the pn junction between the p type silicon substrate 6 and the n type semiconductor region 9 was described, the capacitance can be further increased if a thin oxide film is formed on the n type semiconductor region 9 and an opposed electrode (for example, a first polysilicon gate) is formed thereon. In this case, polysilicon can be partially formed on the surfaces of the vertical hole and the horizontal hole by such a process as a CVD with reduced pressure. With the present technical level, it may be difficult, but is theoretically possible to deposit polysilicon entirely onto the surface of the horizontal hole.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device using a capacitor as a memory device, comprising:

a substrate (6) of a first conductive type formed with a generally vertical hole (21) extending substantially vertically to an upper surface thereof and including an enlarged buried well formed within the substrate at a lower end of the generally vertical hole, a semiconductor region (9) of a second conductive type formed in said substrate (6) of the first conductive type, said semiconductor region (9) extending along said generally vertical hole (21) and along said enlarged buried well, and said enlarged buried well establishing a capacitor region between said substrate (6) of the first conductive type and said semiconductor region (9) of the second conductive type, said buried well being an isotropically etched well thereby having a generally flat bottom surface and including a curved surface region (8) extending continuously between said bottom to the lower end of the generally vertical hole, said well being wider than the generally vertical hole.

2. A semiconductor memory device in accordance with claim 1, wherein
said curved surface region is concave.

3. A semiconductor memory device in accordance with claim 2, wherein
the bottom surface of said well extends within said substrate generally parallel to said upper surface.

* * * * *